United States Patent [19]

Shimada

[11] Patent Number: 5,343,802
[45] Date of Patent: Sep. 6, 1994

[54] OFFSET PRINTING METHOD AND OFFSET PRINTING MACHINE FOR THE SAME

[75] Inventor: Mikinari Shimada, Osaka, Japan

[73] Assignee: Matsushita Electric Industrial Co., Ltd., Kadoma, Japan

[21] Appl. No.: 955,067

[22] Filed: Oct. 1, 1992

[30] Foreign Application Priority Data

Oct. 2, 1991 [JP] Japan .................. 3-255039
Oct. 2, 1991 [JP] Japan .................. 3-255143

[51] Int. Cl.$^5$ ............................ B41F 17/00
[52] U.S. Cl. ........................ 101/35; 101/123; 101/154; 101/376
[58] Field of Search ............ 101/124, 154, 153, 142, 101/216, 123, 35, 376

[56] References Cited

U.S. PATENT DOCUMENTS

| | | | |
|---|---|---|---|
| 4,183,136 | 1/1980 | Colla | 29/620 |
| 4,200,045 | 4/1980 | Toropainen | 101/217 |
| 4,479,432 | 10/1984 | Masaki et al. | 101/154 |
| 4,588,279 | 5/1986 | Fukuchi et al. | 355/3 TR |
| 4,767,465 | 8/1988 | Nakamura et al. | 106/413 M |
| 4,945,827 | 8/1990 | Audi et al. | 101/124 |

*Primary Examiner*—Edgar S. Burr
*Assistant Examiner*—Ren Yan
*Attorney, Agent, or Firm*—Willian Brinks Hofer Gilson & Lione

[57] ABSTRACT

An offset printing method wherein, by using a screen stencil, ink is once printed on a transfer sheet whose top most layer is made of silicone rubber, and thereafter, the ink is transferred from said transfer sheet onto a substrate to be printed on, or by the use of an ink containing at least an organic solvent and a thermoplastic resin, the ink is transferred from said transfer sheet onto a substrate for printing through heating said substrate for printing or said transfer sheet, and an offset printing machine to be employed in said offset printing method which comprises, at least, a screen stencil movable in the horizontal direction, a rotatable cylindrical roller with a transfer sheet whose top most layer is made of silicone rubber being wound thereon, and a squeeze movable up and down.

7 Claims, 3 Drawing Sheets

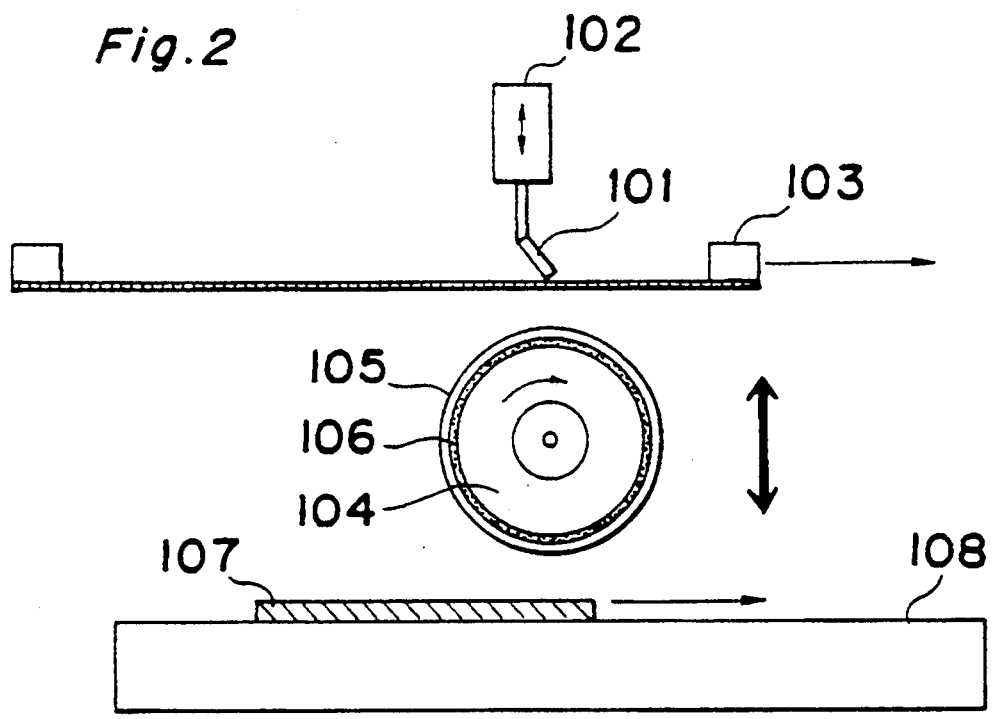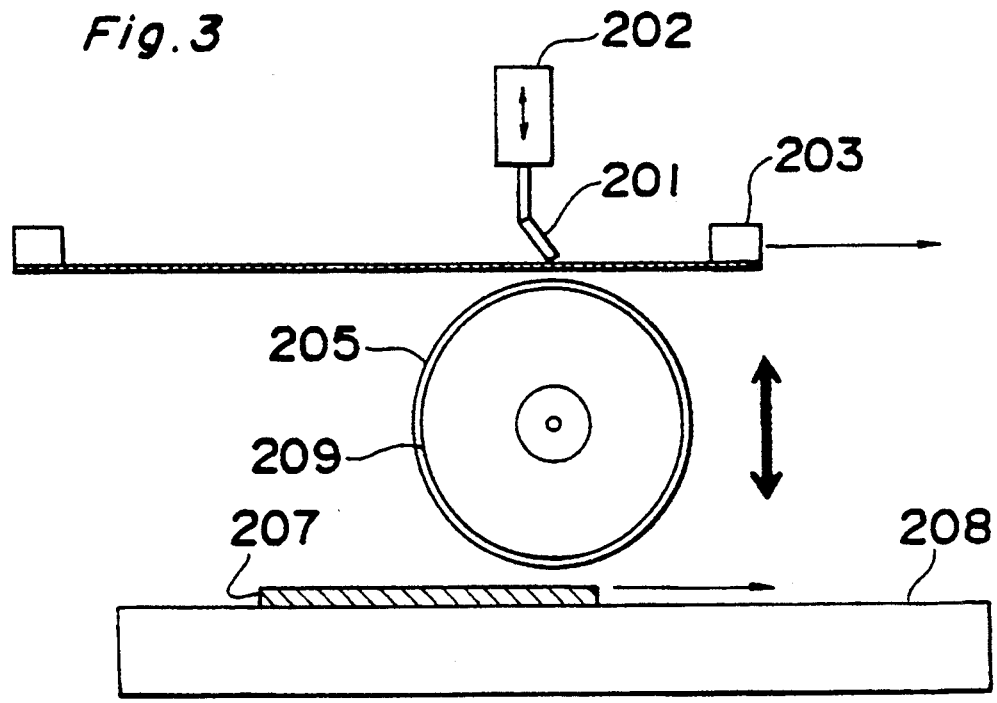

OFFSET PRINTING METHOD AND OFFSET PRINTING MACHINE FOR THE SAME

BACKGROUND OF THE INVENTION

1. Field of the Invention

The present invention relates to an offset printing method utilizing a fine-line printing technology for forming a fine conductive wiring pattern on a circuit board, etc. by printing, and more particularly, utilizing the transfer method and an offset printing machine to be employed for said offset printing method.

2. Description of the Prior Art

Accompanying the miniaturization of electronic devices, multi-layering and high density packaging of circuit boards to be employed therefor has been required. In order to satisfy this requirement, it is indispensable to miniaturize the wiring of the circuit board. In recent years, by the development of the COB (Chip on Board) technology, the wiring on the circuit board has been further miniaturized and a fine wiring of 50 $\mu$m width lines at 100 $\mu$m pitch has been required.

Conventionally, in the fabrication of a hybrid IC employing a ceramic substrate and multilayered ceramic substrate, the wiring of Cu or Ag/Pd of a comparatively low resistivity by which the resistance of conductive wiring can be made low has been formed by employing the screen printing method which is simple and capable of a thick film printing. The screen printing method is already known and the most widely used method excellent in the productivity.

However, in the conventional screen printing method, a fine wiring printing of 75 $\mu$m width line and 150 $\mu$m pitch is the limit of the method, and further when a printing failure such as overlap between printed lines or cut-off of printed line takes place, the substrate has to be discarded. In printing on the substrate, overlap between printed lines takes place due to a large output volume of ink or ink flow. The printed line cut-off is more likely to take place in a more fine line. This is caused because ink can not get access to the non-opening portion of the screen mesh where ink is not discharged. Although it is reported in the research level (ISHM 1990 Proceedings pp. 445–452) that fine lines of 30 to 50 $\mu$m width were printed by the screen printing method, the screen printing method is likely to cause overlap between printed lines, and many problems are left to be solved before it is introduced into the mass production. Besides the printing method, the inspection method, and the discard of defective printing substrate are also big problems.

Furthermore, the screen printing method has also a problem that when the substrate has a surface irregularity, printing can not be provided over the entire surface of the substrate. In order to solve this problem, the transfer printing method is effective. As the technology relating to this method, there are available, for example, a transfer method employing a transfer sheet having a release layer and an adhesive layer (U.S. Pat. No. 5,069,954) and a solvent-free thermoplastic ink (U.S. Pat. No. 4,472,537 and U.S. Pat. No. 4,426,227) to be employed for the transfer with silicone rubber. With mere employment of these methods and ink, it is difficult to form a thick film printing line of 30 to 50 $\mu$m width, and thus a new technology is required.

Further, in Japanese patent publication Hei 1-17278, there is proposed an apparatus for printing on curved surfaces wherein a thin strip-like rubber is used as a transferring medium and a print mechanism for printing thick paste on said strip-like rubber, a transferring device for pressing said strip-like rubber onto a substance to be printed and a positioning device for holding said substance having curved surfaces.

However, this invention is intended to print thick paste on curved surfaces, for example, edges of a substrate and not intended to minimize the width of each line to be printed.

SUMMARY OF THE INVENTION

An essential object of the present invention is to provide an offset printing method excellent for the mass production which is able to easily form thick film fine lines of 30 to 100 $\mu$m width with a good quality, further having the capability of printing on a substrate having concave and convex surfaces and the inspection during the printing operation, and an offset printing machine to be employed for said offset printing method.

In order to achieve the above-mentioned object, according to the present invention, there is provided an offset printing method characterized as follows. By using a screen stencil, ink is printed on a transfer sheet whose upper most surface is made of silicone rubber, and thereafter, said ink is transferred from said transfer sheet onto a substrate on which ink is printed, or by using a screen stencil, ink including at least an organic solvent and a thermoplastic resin is printed on a transfer sheet whose upper most surface is made of silicone rubber, and thereafter, a substrate to be subjected to printing or said transfer sheet is heated so as to transfer said ink from said transfer sheet to said substrate for printing, and more preferably, at least a part of said transfer sheet is wound around a cylindrical roller arranged horizontally with respect to said screen stencil and using a squeegee, ink is printed on said transfer sheet wound around said cylindrical roller.

The copolymer of isodecyl methacrylate, isobutyl methacrylate and glycydyl methacrylate is preferable as a binder resin for the ink, and for the transfer sheet, a sheet formed with silicone rubber layer on a resin film of less than 100 $\mu$m thickness is preferable. Furthermore, as the printing form, a screen stencil of 10 $\mu$m thick emulsion film and of more than 300 mesh is desirable. Furthermore, it is desirable to provide an elastic compressible layer on the lower layer of the transfer sheet.

Meanwhile, according to the present invention, there is provided an offset printing machine comprising at least a screen stencil movable in the horizontal direction, a rotatable cylindrical roller disposed under said screen stencil so as to be horizontal with respect to said screen stencil, and a squeegee movable up and down, said offset printing machine being so arranged that a transfer sheet whose upper most layer is made of silicone rubber is at least partly wound around of said cylindrical roller, and by moving said screen stencil horizontally while pressing said squeegee against said screen stencil, ink is printed onto said transfer sheet. Furthermore, it is desirable to provide a perfectly elastic compressible layer on the lower layer of said transfer sheet, and further, it is desirable to provide said printing machine with a function for maintaining the distance between the rotation center of said cylindrical roller with said transfer sheet wound therearound and said screen stencil and the distance between the rotation center of said cylindrical roller and the substrate to be printed on respectively at arbitrary constant values.

In the offset printing method of the present invention, ink is once printed on the silicone rubber by using said screen stencil. By using the screen stencil, thick film lines in all directions can be printed. In case of using an ink including an organic solvent, since the silicone rubber absorbs the solvent, the printed ink becomes high in viscosity immediately after the printing and the ink is hard to drip. Therefore, a printing having a narrower pitch as compared with the conventional screen printing can be realized. Furthermore, on the silicone rubber, since the solvent in the ink is further absorbed, the ink becomes like a film and difficult to be spread.

By pressing the silicone rubber against the substrate to be printed on when the solvent is properly absorbed, the ink is all transferred onto the substrate. This is because silicone rubber has an excellent release property, and further, printing can be effected on an undulated surface because of the elasticity of silicone rubber. On the other hand, when the ink is left on silicone rubber for a long time, the ink is dried too much and may result in the deterioration of the transferability on the substrate to be printed on, but in the offset printing method of the present invention, by using an ink containing at least an organic solvent and a thermoplastic resin and transferring the ink after drying said transfer sheet with ink printed thereon or the substrate before printing, the offset printing can be effected by the adhesive force of the thermoplastic resin even if the organic solvent in the ink has been absorbed completely. Particularly, since the ink employing a copolymer of isodecyl methacrylate, isobutyl methacrylate and glycidyl methacrylate, a good quality transferring is possible. Furthermore, since this resin has a thermal decomposition property and the removal of the binder in a low oxygen density atmosphere is possible, it can be used for an ink using an easily oxidized metallic powder such as copper. Before this transfer operation, an intermediate inspection is possible and thereby, the printing state of ink on the transfer sheet may be inspected so as to realize the transfer of the good quality printing only.

Furthermore, in the offset printing method of the present invention, it is desirable to wind at least partly a transfer sheet whose top most layer is made of silicone rubber on the side surface of a rotatable cylindrical roller horizontally fixed with respect to the screen stencil so as to transfer onto the curvature portion of the transfer sheet. The reason is in that by the forcible separation of the transfer sheet from the screen stencil, a smooth release from the pattern (separation of the transfer sheet at the printing time from the screen stencil) and a good quality printing becomes possible.

Furthermore, as the transfer sheet, it is desirable to employ a transfer sheet in which a silicone rubber layer is formed on a resin film of less than 100 $\mu$m thickness. The reason lies in that when a resin film of less than 100 $\mu$m thickness is employed, the transfer sheet itself is soft and flexible and sticks to the substrate for printing more flexibly, an easy transfer with little deformation becomes possible. With respect to the thickness of the silicone rubber layer, although the thicker layer improves the printability and transferability on to the curved surface, in the case of effecting the transfer of small change in dimensions, the thinner layer is better, and particularly a thickness of less than 1 mm is preferable. Meanwhile, when an elastic compressible layer is provided on the lower layer of the transfer sheet, since the transfer sheet absorbs the uneven printing thickness and the stress of silicone rubber, a printing with a further improved accuracy can be effected.

It is desirable to employ for the screen stencil a screen stencil of 10 to 30 $\mu$m thick emulsion film and more than 300 mesh. The reason lies in that, in the case of effecting a fine line printing of less than 50 $\mu$m line width, if the emulsion film is thicker, the ink is more easily turned around through the screen mesh by that much, and therefore, the line cut-off is hard to take place and a printing in which the scattering in printed film thickness is smaller becomes possible. Furthermore, since the emulsion film thickness is thick and the emulsion edge is sharp, a printing of fine lines having a good linearity becomes possible.

Meanwhile, the offset printing machine of the present invention can execute easily and at a good mass productivity the printing onto the transfer sheet according to the offset printing method of the present invention. The offset printing machine of the present invention is so constructed that the squeegee and the cylindrical roller are fixed so as not to be moved in the horizontal direction and the screen stencil is moved horizontally.

Since the cylindrical roller is rotated in synchronization with the movement of the screen stencil and the transfer sheet is wound around the cylindrical roller, a high accuracy printing can be effected. Furthermore, when a mechanism for maintaining the distance between the rotation center of the cylindrical roller with the transfer sheet wound therearound and the surface of the substrate to be printed on at an arbitrary constant value is used, the rotation radius of the cylindrical roller suppresses the change (change in circumferential length), and a further high accuracy printing can be effected.

By the above-described construction, the offset printing method of the present invention is able to reduce short-circuiting and line cut-off and easily form the thick film fine line wiring of 30 to 100 $\mu$m line width, and further, is able to realize an offset printing method which is capable of the printing on a concave and convex undulated surface and the inspection during printing operation and excellent in the mass productivity. Furthermore, the offset printing machine of the present invention is able to realize an offset printing machine excellent in the mass productivity which is capable of easily effecting a thick film fine line wiring of a narrow wiring pitch and 30 to 100 $\mu$m line width without short-circuiting and at a good printing quality.

BRIEF DESCRIPTION OF THE DRAWINGS

These and other objects and features of the present invention will become clear from the following description taken in conjunction with the preferred embodiments thereof with reference to the accompanying drawings, in which:

FIG. 2 is a schematic side view showing essential parts of the offset printing machine according to the present invention;

FIG. 3 is a schematic side view showing another structure of essential parts of the offset printing machine according to the present invention;

DETAILED DESCRIPTION OF THE PREFERRED EMBODIMENTS

Figure 1:
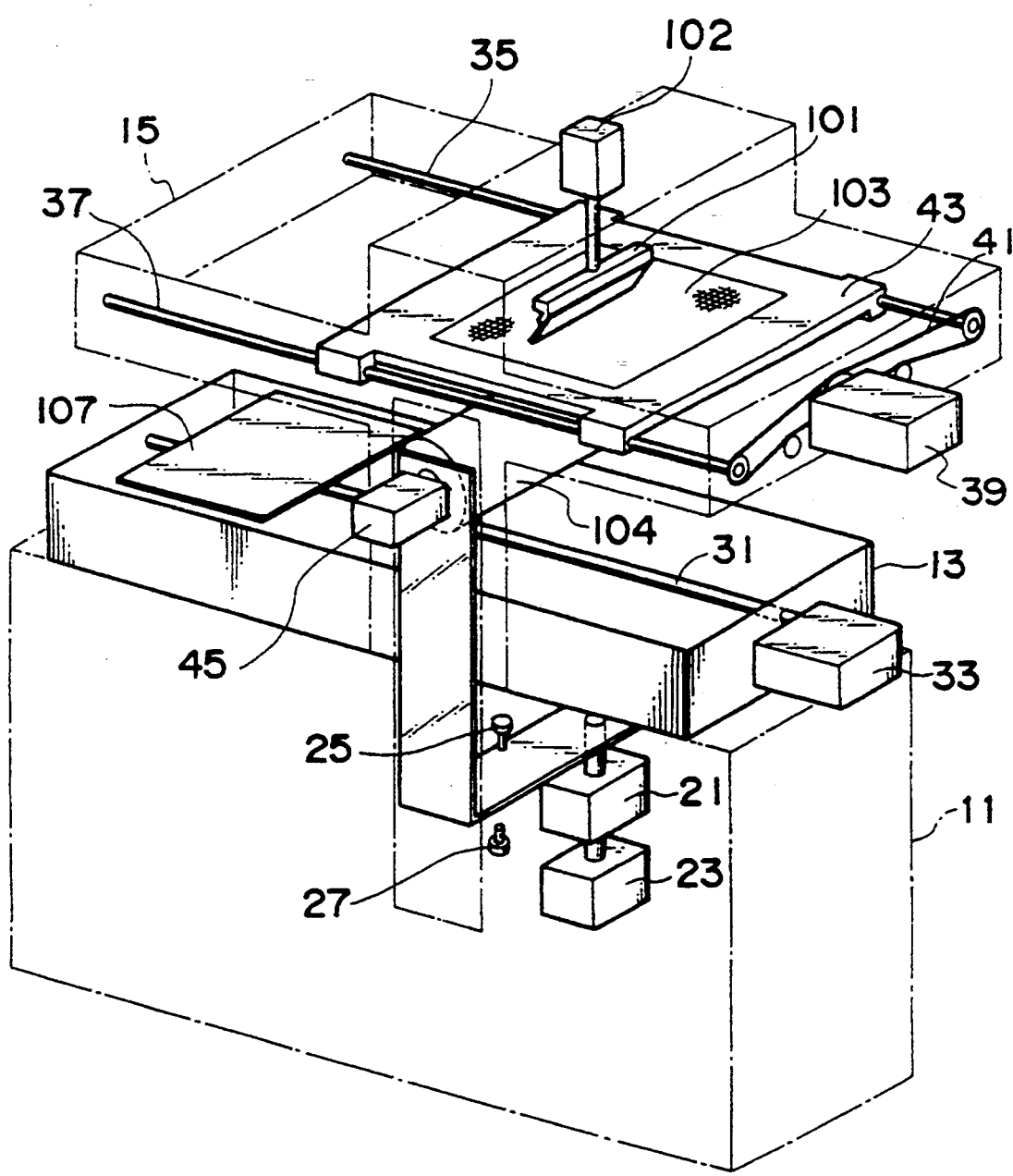
FIG. 1 is a perspective view of an offset printing machine according to a preferred embodiment of the present invention.

FIG. 1 shows essential parts of the offset printing machine according to the present invention.

As shown in FIG. 1, the offset printing machine has a base frame 11 on the upper plane of which an X-axis table 13 is mounted, an upper frame 15 supported by the base frame 11 above the X-axis table 13 in parallel thereto.

Between the upper frame 15 and the X-axis table 13, a cylindrical roller 104 as a transfer means is supported by a U-shaped support frame 18 which is controlled by two air cylinders 21 and 23 so that the roller 104 may take upper, intermediate and lower positions. Two stoppers 25 and 27 are provided for positioning the roller 104 at upper and lower positions, respectively.

The X-axis table 13 is provided with a ball screw 31 arranged along the lengthwise center line (X-axis) of the table which is driven by an AC servo motor 33. A sheet material 107 such as a circuit board to be printed, where it is set on the X-axis table 13, is fed in the lengthwise direction by driving the ball screw 31 with the AC servo motor 33.

Inside of the upper frame 15, a pair of ball screws 35 and 37 are arranged in parallel to each other and to the X-axis table 13 which are synchronously driven by an AC servo motor 39 via a driving belt 41. A support frame 43 for setting a screen stencil 103 is engaged with said pair of ball screws 35 and 37 so that the screen stencil 103 may be fed in the X-direction when driven by the AC servo motor 39. Above the screen stencil 103, a squeegee 101 is supported by an air cylinder 102 so that the same can take a lower position for squeezing the screen stencil 103 and an upper position not contacting thereto.

Further, a motor 45 is provided for positioning the roller 104 at a predetermined original rotation 104 at a predetermined original rotation position upon starting a transfer from the screen stencil 103 to the roller 104. The motor 45 makes the roller 104 free during the transfer operation.

As shown in FIG. 2, the cylindrical roller 104 has a silicone rubber layer 105 of 500 μm thickness laminated on a polyethylene terephtalate layer of 75 μm thickness which is wound around the entire periphery of the roller body via a compressive layer 106.

As the screen stencil 103, a screen stencil of 400 mesh with emulsion film thickness of 10 μm is employed.

Further, as a printing ink, a copper ink is employed.

The composition of the employed copper ink is as follows.

| | |
|---|---|
| copper powder | 77.9 wt % |
| glass powder | 4.1 wt % |
| thermoplastic resin | 9.8 wt % |
| solvent (diethyleneglycol monobutyl ether acetate) | 6.6 wt % |
| dispersant | 0.8 wt % |
| additive | 0.8 wt % |

Furthermore, the thermoplastic resin employed for said ink is a copolymer of isodecyl methacrylate, isobutyl methacrylate and glycidyl methacrylate having the following composition.

| | |
|---|---|
| isodecyl methacrylate | 70 wt % |
| isobutyl methacrylate | 20 wt % |
| glycidyl methacrylate | 10 wt % |

In operation of the offset printing machine mentioned above, the roller 104 is returned to its original rotational position by driving the motor 45 while supporting the same at the intermedinate position at first. At the same time, the screen stencil 103 is set at its starting position by driving the AC servo motor 39.

After applying the prepared copper ink on the screen stencil 103 while maintaining the squeegee 101 at a lifted position, the roller 104 is lifted up by one step so that the same contacts with the screen stencil 103 at the initial position thereof and, at the same time, the squeegee 101 is lowered by the air cylinder 102 so that it can squeeze the screen stencil 103 on which the ink is applied.

Then, the AC servo motor 39 is driven to feed the screen stencil 103 forwardly in the X-direction while maintaining the roller 104 in a rotation free state. In accordance with the feed of the screen stencil 103, the roller 104 is rotated and the copper ink is printed on the transfer sheet 105 wound around the roller 104. Thereby, a pattern of the printing area on the screen stencil 103 is printed on the transfer sheet 105.

When the wiring pattern is completely transferred to the transfer sheet 105, the AC motor 39 is turned off and the roller 104 is lowered by one step and is rotated back to the predetermined original rotation position at the intermediate position. Thereafter, the roller 104 is lowered to the lower position while maintaining the sheet to be printed at an initial position from which print operation is started. When the roller 104 is lowered, it does not contact with the near components. Then, the AC servo motor 33 is started to drive and, thereby, the sheet 107 is fed forwardly while maintaining a pressed state with the roller 104.

Thus, the print pattern transferred to the transfer sheet 105 is printed on the sheet 107.

The quality of the fine lines was excellent with the line width of 50 μm and thickness of about 9 μm. In this case, the accuracy of printing repeatability was ±10 μm at 90 mm square in 10 printing samples. Furthermore, even when the copper ink was dried on the transfer sheet 105, the copper ink fine lines of about 50 μm width and film thickness of about 9 μm could be transferred onto the substrate for printing 107 by heating said substrate 107 at about 40° C.

It is to be noted here that the driving method and so on of the offset printing machine of the present invention are not limited to those in the present embodiment, but the cylindrical roller may be driven or may be added with a heading device for heating the substrate for printing or a function of synchronizing the rotation speed of the cylindrical roller with the moving speed of the screen stencil and the x-axis table may be added.

Second preferred embodiment

Figure 4:
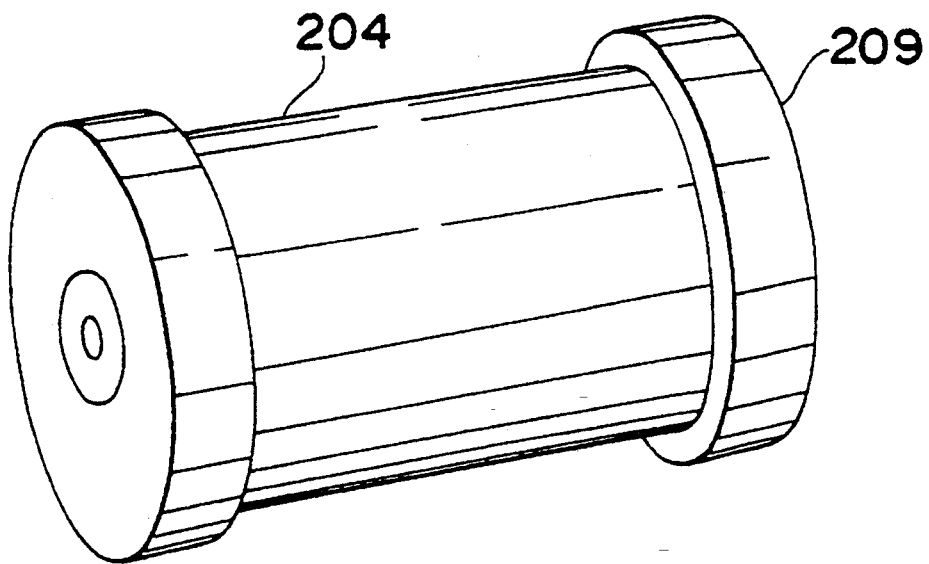
FIG. 4 is a perspective view of the cylindrical roller shown in FIG. 3.

Hereinbelow, a second embodiment of the offset printing method and the offset printing machine of the present invention will be described with reference to the accompanying drawings. FIG. 3 is a schematic construction diagram showing the basic function of the offset printing machine of the second embodiment, which includes a squeegee 201, an air cylinder 202, a screen stencil 203, a transfer sheet 205, a substrate for printing 207, an X-axis table 208 and guide rollers 209. FIG. 4 is a perspective view showing the construction of the cylindrical roller portion in the present embodiment. In FIG. 4, reference numeral 204 is the cylindrical roller. A transfer sheet having a silicone rubber layer of 500 $\mu$m thickness formed on a polyethylene terephtalate layer of 75 $\mu$m thickness was wounded over the entire side surface of the cylindrical roller 204 via a compressible layer and fixed thereto, as in the first embodiment. In this case, the radius of the silicone rubber surface of the transfer sheet was made larger by about 300 $\mu$m than the radius of the guide roller 209. The squeegee 201 is moved up and down by the air cylinder 202. The screen stencil 203 is arranged to be movable in the horizontal direction by a motor. The guide rollers 209 are provided on both ends of the cylindrical roller 204 to maintain constant the distance between the surface of the substrate for printing 207 and the rotation center of the cylindrical roller 204. During the transfer operation, the guide rollers 209 are able to rotate always in contact with the upper surface of the X-axis table 208 or the surface of the substrate for printing 207. Meanwhile, the cylindrical roller 204 is able to move up and down by being fixed to a jig so as to remain parallel with the screen stencil 203 and the X-axis table 208.

In the offset printing machine of the present embodiment, by moving the screen stencil 203, the cylindrical roller 204 is rotated in synchronization with this movement. Furthermore, by moving the X-axis table 208 with the cylindrical roller 204 wounded with the transfer sheet 205 being pressed against said substrate for printing 207, the cylindrical roller 204 can be rotated, thereby to transfer the ink onto the substrate for printing 207.

As the screen stencil 203, a screen stencil of 15 $\mu$m thick emulsion film and 400 mesh was employed. First, the squeegee 201 was a little lifted, and after applying the same ink as that in the first embodiment over the screen stencil 203, the copper ink was printed on the silicone rubber layer of the transfer sheet 205 by moving the screen stencil 203 while being applied with a printing pressure by the squeegee 201. No attaching lines to each other or no line cut-off was caused in the thick film fine lines and the printing result was of a good linearity. Subsequently, the cylindrical roller 204 wounded by a transfer sheet 205 around its surface was immediately pressed against the substrate for printing 207, and by moving the X-axis table 208, the copper ink was transferred onto the substrate for printing 207, with a good printing quality of the fine lines printed thereon. The line width was 50 $\mu$m, and the thickness was about 10 $\mu$m. The accuracy of printing repeatability was $\pm 8$ $\mu$m at 90 mm square in 10 printing samples. Furthermore, even when the copper ink was dried on the transfer sheet 205, the copper ink could be printed onto the substrate for printing 207 by heating said substrate at about 40° C.

It is to be noted here that the mechanism and so on of the offset printing machine according to the present invention is not limited to those in the present embodiment.

Third preferred embodiment

Figure 5:
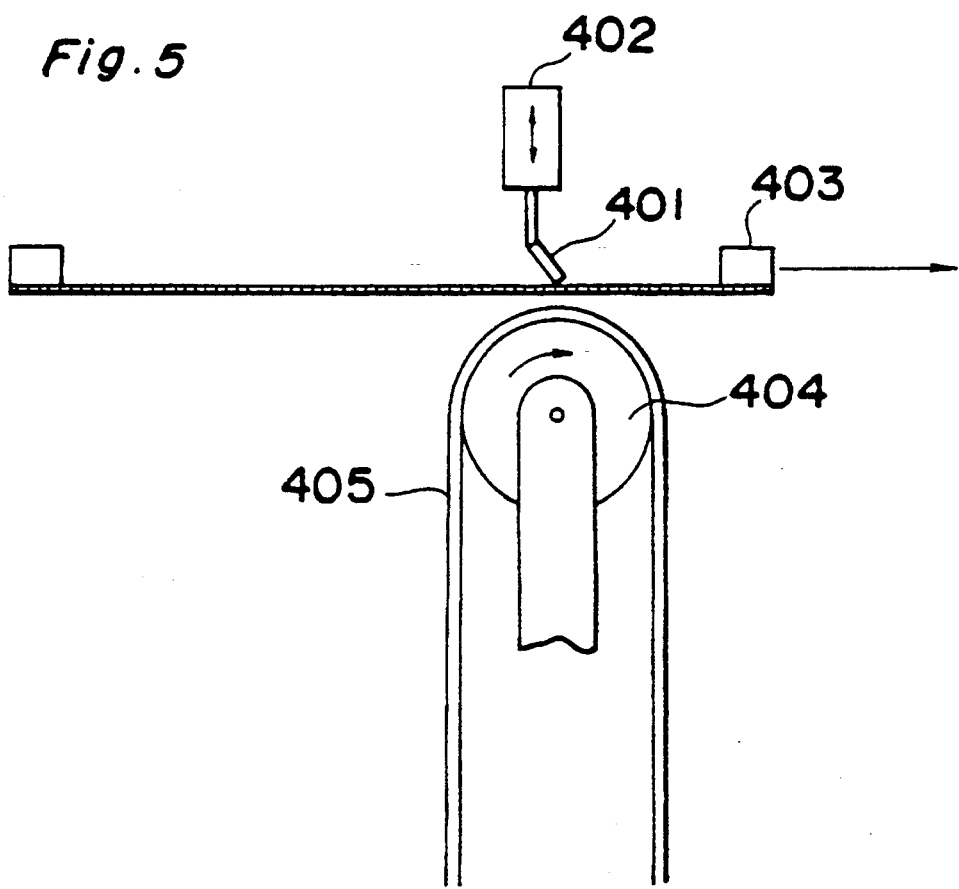
FIG. 5 is a schematic side view showing a third embodiment of the present invention.

A third embodiment of the offset printing method and the offset printing machine of the present invention will be described hereinbelow with reference to the accompanying drawing. FIG. 5 is a schematic construction diagram showing the basic function of the offset printing machine in the third embodiment, which includes a squeegee 401, an air cylinder 402, a screen stencil 403, a cylindrical roller 404, and a transfer sheet 405. The squeegee 401 is moved up and down by the air cylinder 402. The screen stencil 403 is arranged to be moved in the horizontal direction by a motor. On the cylindrical roller 404, the transfer sheet 405 having a 250 $\mu$m thick silicone rubber layer formed on a 35 $\mu$m thick polyethylene terephtalate layer was arranged so as to be partially wound thereon. The transfer sheet 405 is formed in a roll-shape at its both ends.

In the present offset printing machine, by moving the screen stencil 403, the cylindrical roller 404 is rotated in synchronization with this movement. Namely, the surface of the transfer sheet 405 can be moved in synchronization of the movement of the screen stencil 403.

As the screen stencil 403, a screen stencil of 25 $\mu$m thick emulsion film of 325 mesh was employed and as the ink, the same copper ink as used in the first embodiment was employed. When the ink was printed on the transfer sheet 405, good quality thick film fine lines of 30 $\mu$m width could be formed without causing attaching of lines or line cut-off on the silicone rubber of the transfer sheet 405. Furthermore, by pressing this transfer sheet 405 on which the ink was printed against the substrate for printing, thick film fine lines of 30 $\mu$m width could be formed on the substrate for printing.

It is to be noted here that the construction of the offset printing machine of the present invention is not limited to the offset printing machine, but, for example, the up-down mechanism may be provided on the screen stencil 403.

Fourth preferred embodiment

Hereinbelow, a fourth embodiment of the offset printing method of the present invention will be described. Although the basic construction of the employed offset printing machine is the same as the first embodiment, as a printing pattern, a screen stencil of 25 $\mu$m thick emulsion film, 300 mesh and 40 $\mu$m minimum line width was employed and for the transfer sheet, a member composed of a 75 $\mu$m thick polyethylene terephtalate and layer and a 250 $\mu$m thick silicone rubber layer was employed. Moreover, between the silicone rubber on the surface of the cylindrical roller and the screen stencil, a gap of 1 mm was provided. The transfer sheet was wound around the side surface of a rotatable stainless steel roller. The ink shown below was prepared and employed. The composition of the thermoplastic resin was the same as in the first embodiment.

| copper powder | 74.0 wt % |
| glass powder | 4.0 wt % |
| thermoplastic resin | 13.0 wt % |
| solvent (diethyleneglycol monobutyl ether acetate) | 8.2 wt % |
| dispersant | 0.8 wt % |

By moving the screen stencil while applying a printing pressure by the squeegee, the ink was printed on the silicone rubber. When the transfer sheet was observed, the linearity of the fine lines in the longitudinal and lateral directions was excellent with no line cut-off or attachment of lines with each other. The lines of 40 $\mu$m width were about 6 $\mu$m thick.

After being left for 6 hours for the quality inspection to be effected thereafter, when the transfer sheet was pressed against an alumina substrate heated at 40° C., the copper ink was all transferred onto the alumina substrate. When this substrate was fired in nitrogen gas atmosphere, a good copper wiring was obtained. Furthermore, the printing of 30 μm width lines was also possible. Although the printing and transfer was possible even with use of a screen stencil of 10 μm thick emulsion film, the printing line width had a tendency to become larger than the design line width, while, on the contrary, in case of a screen stencil of 35 μm thick emulsion film, clogging of the ink was observed. Furthermore, in the case where a resin film of 300 μm thickness was employed for the transfer sheet resin film, the uneven adhesion of ink was likely to take place in the transfer onto an undulated alumina substrate, which needed attention.

It is to be noted here that although the printing was effected by moving the screen stencil in the present embodiment, the present invention is not limited to this, but the printing may be effected by moving the transfer sheet and the squeegee with the screen stencil being fixed.

Fifth preferred embodiment

A fifth embodiment of the printing method of the present invention will be described below. For the ink, the same copper ink as the fourth embodiment was employed. Although the basic construction of the employed offset printing machine was the same as in the first embodiment, for the printing form, a screen stencil of 25 μm thick emulsion film, 300 mesh and 40 μm minimum line width was employed and for the transfer sheet, a transfer sheet in which a silicone adhesive (TOSHIBA SILICONE) was applied with a doctor blade on a 75 μm thick polyethylene terephtalate (TEIJIN) and heat cured was employed. The thickness of the silicone rubber was about 300 μm. This transfer sheet was wound around the side surface of a stainless steel cylindrical roller. A gap of 1 mm was provided between the silicone rubber on the cylindrical roller and the screen stencil.

By moving the screen stencil while applying a printing pressure with a urethane squeegee, the ink was printed on the silicone rubber.

Furthermore, the printing of 30 μm width lines was also possible. Although the printing transfer was possible even with the use of a screen stencil of 10 μm thick emulsion film, a tendency that the printed line width became a little larger than the design line width was observed. On the contrary, with the use of a 300 μm thick resin film as the transfer resin film, the uneven sticking of the ink was likely to take place in the transfer onto an undulated alumina substrate, etc., which required attention.

It is to be noted here that although the printing was effected by moving the screen stencil in the present embodiment, the present invention is not limited to this but the printing may be effected by fixing the screen stencil and moving the transfer sheet and the squeegee.

Sixth preferred embodiment

A sixth preferred embodiment of the printing method according to the present invention will be described below. For the ink, the same copper ink as the fourth embodiment was employed. For the printing form, a glass intaglio printing fabricated by wet-etching was employed. The pattern thereof was a stripe with 30 μm width and 60 μm pitch. The transfer sheet having a polyethylene terephtalate layer of 75 μm thickness stacked on a silicone rubber layer of 250 μm thickness was employed.

After filling the copper ink into grooves of the glass intaglio printing form using a scraper made of ceramic, a cylindrical roller made of stainless steel around which the transfer sheet was wound was moved on said printing form while rotating the same to print the pattern on the silicon rubber layer. Then, the transfer sheet was peeled apart from the roller to observe the printing quality. The pattern showed a reasonable linearity and the thickness was about 4 μm.

After this observation, the ink was almost solidified. Next, the transfer sheet was pressed on an alumina board heated up to about 40° C. for about five seconds and, then, the same was peeled apart to observe.

A stripe pattern with no breakings was observed although the stripe width was widened by some microns. By burning the board in nitrogen atmosphere at 900° C., a copper wiring exhibiting a reasonable conductivity was obtained.

Immediately after the printing, the transfer sheet 105 was peeled apart from the roller to observe. By the observation, it was confirmed that both longitudinal and transversal fine lines show an excellent linearity and no defects such as breaking of lines or overlapping between lines were observed. The thickness of the line of 40 μm width was about 6 μm.

After leaving the same alone for six hours to test the printing quality, the same was pressed on an alumina board heated up to 40° C. and it was confirmed that the copper ink on the same was completely transferred onto the board. When the copper ink was burned in a nitrogen atmosphere, an excellent copper wiring was obtained.

Seventh preferred embodiment

A seventh preferred embodiment of the printing method with use of the offset printing machine according to the present invention will be described below.

In this embodiment, a roller having land portions at both ends thereof as shown in FIG. 4 was employed. These land portions were provided to guarantee a gap between the roller and the screen stencil and the height of each land was one mm. They were kept to contact with the screen stencil upon printing.

According to the offset printing machine, the roller is rotated in accordance with the movement of the screen stencil. In order to increase a friction between the land and the screen stencil, it is desirable to rough the surface of the land or to form a gear around the land which engages with a linear gear provided on the screen stencil. A screen stencil with 25 μm emulsion thickness and 325 mesh for the screen stencil and for the ink, the copper ink as described in the fourth preferred embodiment were employed.

By printing copper ink on the transfer sheet, thick film fine lines of 30 μm width were formed with an excellent linearity and no overlapping and breaking. It was also observed that the same thick film fine lines of 30 μm width were formed on a circuit board by pressing the transfer sheet thereon.

It is to be noted that the present invention is not limited to the offset printing machine as stated above and, for instance, it is also possible to give a successive printing function by providing a lifting mechanism for moving the screen stencil up and down.

Further, the kind of the screen stencil and that of the squeegee are not limited to those stated above.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. An offset printing apparatus for printing a thick film fine pattern having a width of 50 $\mu$m or smaller and a thickness larger than several $\mu$m on a substrate comprising:

(a) a screen stencil on which a fine pattern to be printed is formed;

(b) a stencil moving means for moving said screen stencil in a horizontal direction;

(c) a squeegee disposed above said screen stencil;

(d) a squeegee support means for supporting said squeegee in contact with said screen stencil and so that said squeegee applies pressure to said screen stencil while allowing movement of said screen stencil;

(e) a cylindrical transfer roller disposed under said screen stencil, said cylindrical roller having a transfer sheet wound thereon via a compressive layer, said transfer sheet comprised of a silicone rubber layer laminated on a resin sheet;

(f) a roller support means for supporting said cylindrical transfer roller rotatably about a center axis thereof so as to enable said cylindrical transfer roller to be positioned at up, neutral or down positions in a vertical direction while keeping said center axis of said cylindrical transfer roller in parallel to said screen stencil;

(g) a positioning means for positioning said cylindrical transfer roller to its original rotation position when said cylindrical transfer roller is placed at said neutral position in the vertical direction;

(h) a distance restriction means for maintaining a distance between said screen stencil and said center axis of said cylindrical transfer roller at a predetermined constant value during transfer operation of said thick film fine pattern onto said transfer sheet;

(i) a substrate support table disposed under said cylindrical transfer roller for supporting the substrate onto which said thick film fine pattern is to be printed; and (j) a table feed means for moving said substrate support table in a horizontal direction while keeping said table in parallel with said center axis of said cylindrical transfer roller and at a predetermined constant distance during transfer operation of said thick film fine pattern onto said substrate;

wherein said thick film fine pattern is transferred from said screen stencil to said transfer sheet by pressing said screen stencil by said squeegee against said cylindrical transfer roller positioned at said up position, while moving said screen stencil, then said cylindrical transfer roller is positioned at said down position via said neutral position, and said substrate support table is moved so that said thick film fine pattern is transferred from said transfer sheet to said substrate supported by said substrate support table.

2. The offset printing apparatus in accordance with claim 1, wherein the silicone rubber layer is 500 $\mu$m in thickness and the resin sheet is a polyethylene terephthalate layer 75 $\mu$m in thickness.

3. The offset printing apparatus in accordance with claim 1, wherein an emulsion film supported by said screen stencil has a thickness of from 10 to 30 $\mu$m and said screen stencil has a mesh density higher than 300 meshes.

4. The offset printing apparatus in accordance with claim 1, wherein said distance restriction means comprises a first guide roller at one end of said cylindrical roller and a second guide roller at the other end of said cylindrical roller, each of said first and second guide rollers having a larger diameter than said cylindrical roller.

5. The offset printing apparatus in accordance with claim 4, wherein the silicone rubber layer is 500 $\mu$m in thickness and the resin sheet is a polyethylene terephthalate layer 75 $\mu$m in thickness.

6. The offset printing apparatus of claim 1 for printing a thick film fine pattern having a width smaller than 50 $\mu$m.

7. The offset printing apparatus of claim 1 for printing a thick film fine pattern having a thickness of about 9 $\mu$m.

* * * * *